US008830587B2

(12) United States Patent
Bhatia et al.

(10) Patent No.: US 8,830,587 B2
(45) Date of Patent: Sep. 9, 2014

(54) METHOD AND APPARATUS FOR COMBINING LIGHT SOURCES IN A PUMP LASER ARRAY

(75) Inventors: Vikram Bhatia, Painted Post, NY (US); Joshua Monroe Cobb, Victor, NY (US)

(73) Assignee: Corning Incorporated, Corning, NY (US)

(*) Notice: Subject to any disclaimer, the term of this patent is extended or adjusted under 35 U.S.C. 154(b) by 381 days.

(21) Appl. No.: 13/118,939

(22) Filed: May 31, 2011

(65) Prior Publication Data

US 2012/0307370 A1 Dec. 6, 2012

(51) Int. Cl.
| | |
|---|---|
| G02B 5/28 | (2006.01) |
| G02B 19/00 | (2006.01) |
| G02B 27/14 | (2006.01) |
| H01S 5/40 | (2006.01) |
| G02B 27/10 | (2006.01) |
| H01S 3/0941 | (2006.01) |
| H01S 3/094 | (2006.01) |
| G02B 6/42 | (2006.01) |
| H01S 5/00 | (2006.01) |

(52) U.S. Cl.
CPC .......... *H01S 5/4012* (2013.01); *G02B 19/0047* (2013.01); *G02B 27/141* (2013.01); *H01S 3/09415* (2013.01); *H01S 3/094053* (2013.01); *G02B 27/1006* (2013.01); *G02B 6/4215* (2013.01); *H01S 3/09408* (2013.01); *G02B 6/4204* (2013.01); *H01S 5/0078* (2013.01); *G02B 19/0028* (2013.01)
USPC ............................ 359/590; 359/634; 359/589

(58) Field of Classification Search
USPC ......... 359/619–634, 290–292, 298, 308, 359, 359/489.19–491.01, 586–590; 353/20, 84; 356/10
See application file for complete search history.

(56) References Cited

U.S. PATENT DOCUMENTS

| | | | |
|---|---|---|---|
| 4,993,812 A | 2/1991 | Matsuoka et al. | |
| 5,243,619 A | 9/1993 | Albers et al. | |

(Continued)

FOREIGN PATENT DOCUMENTS

| | | |
|---|---|---|
| DE | 3929794 | 4/1991 |
| DE | 10328084 A1 | 2/2005 |
| DE | 102006050155 | 4/2008 |

OTHER PUBLICATIONS

Sep. 20, 2012 International Search Report of counterpart application PCT/US12/39919.

(Continued)

*Primary Examiner* — Thomas K Pham
*Assistant Examiner* — Brandi Thomas
(74) *Attorney, Agent, or Firm* — Svetlana Short

(57) ABSTRACT

An apparatus for providing pump light of a first wavelength $\lambda 1$ to a laser that emits a second wavelength $\lambda 2$ has first and second lasers of the wavelength $\lambda 1$ to direct light along first and second axes in a first direction. The first and second axes define a first plane P1. To form a composite light beam of wavelength $\lambda 1$, a filter apparatus has a first filter on a first surface at an oblique angle to the first and second axes and that transmits $\lambda 1$ and reflects $\lambda 2$. A second filter on a second surface parallel to the first surface, reflects $\lambda 1$ and transmits $\lambda 2$. A third filter formed on the first surface coplanar with the first filter reflects $\lambda 1$ and transmits $\lambda 2$. The filter apparatus re-aligns the first and second axes along a second plane P2, orthogonal to P1 and parallel to the first direction.

20 Claims, 16 Drawing Sheets

(56) References Cited

U.S. PATENT DOCUMENTS

| | | | |
|---|---|---|---|
| 5,513,201 | A | 4/1996 | Yamaguchi et al. |
| 5,583,683 | A | 12/1996 | Scobey |
| 5,745,153 | A | 4/1998 | Kessler et al. |
| 5,786,915 | A | 7/1998 | Scobey |
| 5,825,551 | A | 10/1998 | Clarkson et al. |
| 6,167,171 | A | 12/2000 | Grasis et al. |
| 6,198,857 | B1 | 3/2001 | Grasis et al. |
| 6,324,190 | B1 | 11/2001 | Du et al. |
| 6,377,599 | B1 | 4/2002 | Marshall |
| 6,819,402 | B2 | 11/2004 | Augustyn et al. |
| 7,065,105 | B2 | 6/2006 | Ehlers et al. |
| 7,218,451 | B2 * | 5/2007 | Lee et al. ............ 359/618 |
| 7,520,641 | B2 | 4/2009 | Minano et al. |
| 7,537,395 | B2 | 5/2009 | Savage-Leuchs |
| 7,762,465 | B2 | 7/2010 | Knowles et al. |
| 7,764,723 | B2 | 7/2010 | Ovtchinnikov et al. |
| 7,822,304 | B2 | 10/2010 | Hirata |
| 7,830,608 | B2 | 11/2010 | Hu et al. |
| 2004/0067016 | A1 | 4/2004 | Anikitchev et al. |
| 2004/0252744 | A1 | 12/2004 | Anikitchev et al. |
| 2005/0088654 | A1 | 4/2005 | Hu et al. |
| 2006/0182155 | A1 | 8/2006 | Windpassinger et al. |
| 2007/0268946 | A1 | 11/2007 | Schulte et al. |
| 2008/0013163 | A1 * | 1/2008 | Leonardo et al. ........ 359/341.31 |
| 2011/0204258 | A1 * | 8/2011 | Heller et al. ............ 250/459.1 |

OTHER PUBLICATIONS

S. Zhan et al., "Eliminating dead spaces of the laser diode stack in the fast-axis direction using a plane-parallel plate array" Optical Engineering, Sep. 2007, vol. 46(9), pp. 094203-1 to 094203-5.

W.A. Clarkson et al., "Novel Beam Shaping Technique for High Power Diode Bars" Optoelectronics Research Centre, University of Southhampton. Research paper, CLEO '94, Anaheim CA, May 8-13, 1994 vol. 8, pp. 360.

W.A. Clarkson et al.,"Two-mirror beam-shaping technique for high-power diode bars", Optics Letters, vol. 21 No. 6 Mar. 15, 1996, pp. 375-377

Jun. 19, 2013 Invitation to Pay Additional Fees and Partial International Search issued in related application PCT/2013/026815.

\* cited by examiner

METHOD AND APPARATUS FOR COMBINING LIGHT SOURCES IN A PUMP LASER ARRAY

FIELD OF THE INVENTION

This invention generally relates to optical apparatus for combining light from multiple sources and more particularly relates to apparatus and methods for spatial combination of laser light sources with a level of protection from interference such as from a pumped laser.

BACKGROUND

There are many applications for combining lasers and other solid-state light sources. In general, when an application requires more power than can be delivered by a single laser source, a common solution is to combine the light from two or more lasers of the same wavelength. Since the additional lasers are in a physically different location, it becomes necessary to combine and stack the laser output beams together, eliminating as much "dead space" as possible in the combined output beam.

When lasers are combined in this manner, it is often desirable to make the combined source as small as possible (i.e., to have the smallest possible etendue) so that the energy of the combined beam can be effectively and efficiently concentrated and transferred to another optical system. Where lasers emit polarized light, a typical solution for their combination is polarization combining using polarizing optical elements and surfaces. Where neither wavelength difference nor polarization states can be exploited for use in combining the laser light, spatial combination must be used. Spatial combining requires positioning the laser sources and redirection optics in a compact, precision arrangement, so that the combined beams can be packed together as closely as possible, providing source energy while maintaining as low etendue as possible.

One application for which spatial combining of multiple sources is of particular interest is in pump excitation for fiber lasers. In a fiber laser, the active gain medium is an optical fiber doped with suitable rare-earth elements. Pump energy can be provided from a number of types of sources, such as using a set of multiple laser diodes that are fiber-coupled to the gain medium. By using multiple pump sources, higher optical power can be directed to the gain medium. The use of multiple laser sources also allows each of the pump lasers to operate at a lower power level for a given amplifier gain, thereby extending the lifetime of the pump lasers and hence the reliability of the amplifier. This also provides some redundancy in the event that one of the pump lasers fails.

Because a single wavelength is needed for pump energy, the individual sources must be closely matched, making laser diodes a practical choice. However, laser diodes do not provide a beam that is circular in cross section, that is, with highly symmetrical energy distribution about a central axis. Instead, the aspect ratio of the output light is highly asymmetric, with markedly different divergence angles in orthogonal directions, generating an output beam whose length (considered to be along the "slow" axis) can be several times its width (along the "fast" axis). This asymmetric characteristic makes it desirable to stack the component output beams as closely together as possible, to form a composite beam with a more nearly symmetric aspect ratio. As a limiting factor, the input optical fiber for accepting the pump energy has a relatively small numerical aperture (N.A.), which limits the angular extent of the incoming composite beam and makes it desirable to eliminate as much dead space between component beams as possible.

Among solutions that have been implemented or proposed for combining laser sources for use as pump lasers is a modular pump module with vertically staggered laser diodes and corresponding mirrors. FIGS. 1A and 1B show top and side views, respectively, of a typical pump module 10 of this type. In this approach, each of three lasers 12a, 12b, and 12c directs a beam through a corresponding cylindrical lens 14a, 14b, and 14c and to a mirror 16a, 16b, and 16c, respectively. A filter 30 provides a measure of protection from feedback light FB, as described in more detail subsequently. A composite beam 28 is then focused by a lens 18 into an optical fiber 20 for use as pump energy. There is also an additional lens on the end of each laser 12a, 12b, and 12c, not shown in these figures.

As the side view of FIG. 1B shows, with vertical distance intentionally exaggerated for clarity, the lasers 12a, 12b, and 12c and their corresponding cylindrical lenses 14a, 14b, and 14c and mirrors 16a, 16b, and 16c are vertically staggered. This arrangement of reflective components leaves little tolerance room between the component output beams. The light from laser 12a is clipped by the top of mirror 16b, for example. Similarly, the light from laser 12b is clipped by the top of mirror 16c. The inset W in FIG. 1A shows how composite beam 28 is formed, with an output beam 22a from laser 12a, an output beam 22b from laser 12b, and an output beam 22c from laser 12c. There is necessarily some dead space 24 between the output beams due to tolerances needed to pass the beams by the fold mirrors 16b and 16c.

While the solution described with reference to FIGS. 1A and 1B has proved to be workable, there is room for improvement. Manufacturing tolerances are tight, with little room for variability in fabrication. Each component must be precisely aligned, so that the light is properly redirected from mirrors 16a, 16b, and 16c. Because each laser reflects off a different mirror, thermal variations between the mirrors 16a, 16b, and 16c adversely affect the alignment of the system during operation. Significantly, for practical reasons, this type of solution allows only a restricted number of lasers, three or fewer, to be combined. The aspect ratio of the composite output beam is fixed by the design of the combining system.

Other proposed solutions for beam shaping and combination, such as using angled light pipes or using various arrangements of combining mirrors fall short of what is needed and impose other constraints, such as by restricting the number and arrangement of lasers that can be combined, or by fixing the aspect ratio of the resulting beam. These conventional solutions for combining separate light beams for laser pump light fail to address the problem of potential damage from feedback light generated by the fiber laser itself. The laser light that is generated at high power in the laser is at a different wavelength from the pump laser wavelength, typically a longer wavelength. Even where a small amount of this fiber laser light finds its way back to the pump lasers, damage to the pump lasers can occur. To compensate for this problem, manufacturers of pump laser diode modules routinely add one or more filters at the output of the pump module in order to attenuate any feedback from the fiber laser. FIG. 1A shows filter 30 provided along the path of composite beam 28 for this purpose, attenuating and blocking feedback light FB. This solution, however, adds cost and components to the design of the pump light module.

In general, the more effective the filter attenuation for unwanted wavelengths and transmission for desired wavelengths, the more complex and high cost the filter. Filters that have particularly sharp transitions between transmission and reflection can also exhibit more pronounced "ringing" or ripple over unwanted wavelengths. In addition, degradation of filter performance over time, such as due to the high energy levels concentrated over small regions of the filter surface, makes this solution less than satisfactory in some applications, and leads to reduced component life.

Thus, it can be seen that there is a need for a method and apparatus for spatially combining light sources, where the method and apparatus are suitable for use with a variable number of laser diodes or other laser sources and help to solve the problem of reducing or eliminating feedback light from a fiber laser or other pumped laser source.

SUMMARY

It is an object of the present invention to advance the art of laser beam combination. With this object in mind, the present disclosure provides an apparatus for providing a pump light of a first wavelength $\lambda 1$ to a laser that emits a second wavelength $\lambda 2$, comprising:

a first laser of the first wavelength $\lambda 1$ that is energizable to direct light along a first axis in a first direction;

a second laser of the first wavelength $\lambda 1$ that is energizable to direct light along a second axis parallel to the first axis, wherein the first and second axes define a first plane P1; and a filter apparatus that is disposed to form a composite light beam of the first wavelength $\lambda 1$, the filter apparatus formed on a transparent body that is disposed in the path of the directed light and having:

(i) a first filter that is formed on a first surface of the filter apparatus that is disposed at an oblique angle to the first and second axes and that is transmissive to $\lambda 1$ and reflects $\lambda 2$;

(ii) a second filter that is formed on a second surface of the filter apparatus that is parallel to the first surface, wherein the second filter reflects $\lambda 1$ and transmits $\lambda 2$;

(iii) a third filter that is formed on the first surface of the filter apparatus, coplanar with the first filter, and wherein the third filter reflects $\lambda 1$ and transmits $\lambda 2$;

wherein the filter apparatus re-aligns the first and second axes along a second plane P2 that is orthogonal to P1 and parallel to the first direction.

In an alternate embodiment, the present invention provides an apparatus for providing a pump light of a first wavelength $\lambda 1$ to a laser that emits a second wavelength $\lambda 2$, comprising:

a first laser of the first wavelength $\lambda 1$ that is energizable to direct light along a first axis in a first direction;

a second laser of the first wavelength $\lambda 1$ that is energizable to direct light along a second axis parallel to the first axis, wherein the first and second axes define a first plane P1; and a filter apparatus that is disposed to form a composite light beam of the first wavelength $\lambda 1$, the filter apparatus formed on a transparent body that is disposed in the path of the directed light and having:

(i) a first short wavelength pass filter that is formed on a first surface of the filter apparatus that is disposed at an oblique angle to the first and second axes and that is transmissive to $\lambda 1$ and reflects $\lambda 2$;

(ii) a first long wavelength pass filter formed on a second surface of the filter apparatus that is parallel to the first surface, wherein the first long wavelength pass filter reflects $\lambda 1$ and transmits $\lambda 2$;

(iii) a second long wavelength pass filter that is formed on the first surface of the filter apparatus and wherein the second long wavelength pass filter reflects $\lambda 1$ and transmits $\lambda 2$;

wherein the filter apparatus re-aligns the first and second axes along a second plane P2 that is orthogonal to P1 and parallel to the first direction.

A feature of the present invention is the use of a combination of short wavelength pass and long wavelength pass filter components for forming the composite pump light beam from individual component beams.

An advantage of the present invention is the capability to adjust the aspect ratio of the composite beam formed from individual laser beams and to increase or reduce the amount of dead space between the component beams.

Another advantage of the present invention is its capability to combine the light from a variable number laser sources and provide a level of protection for these sources without requiring highly expensive filters.

Other desirable objectives, features, and advantages of the disclosed invention may occur or become apparent to those skilled in the art. The invention is defined by the appended claims.

DETAILED DESCRIPTION

Figure 1A:
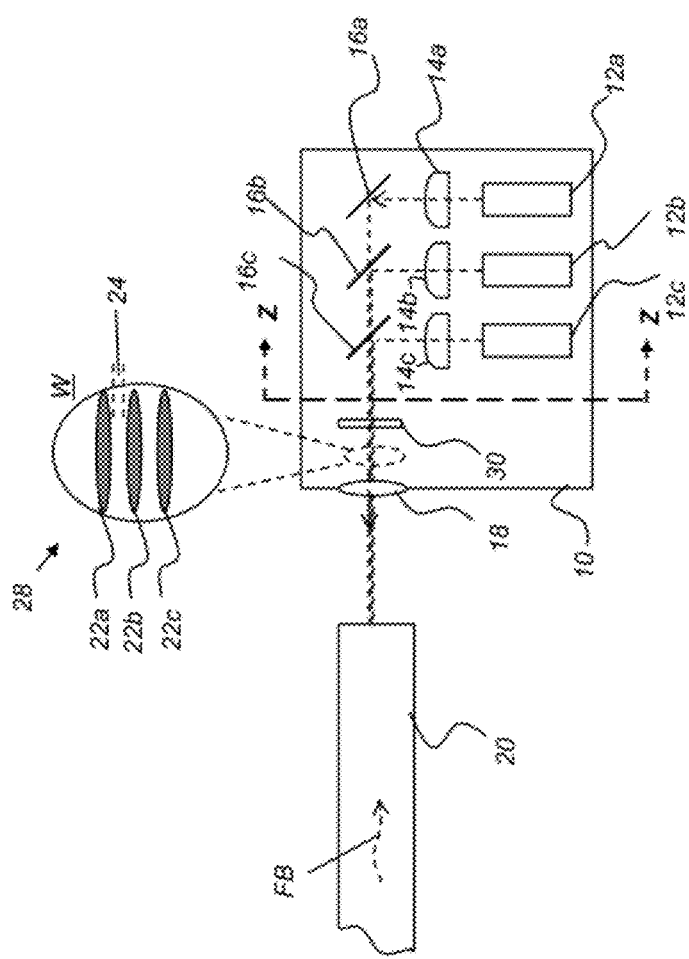
FIG. 1A is a top view block diagram of a conventional laser pump module for combining lasers to provide a composite beam.

Figures shown and described herein are provided in order to illustrate key principles of operation and fabrication for an optical apparatus according to various embodiments and a number of these figures are not drawn with intent to show actual size or scale. Some exaggeration may be necessary in order to emphasize basic structural relationships or principles of operation. For example, some coplanar structures may be shown slightly offset from each other in views where these structures overlap.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light beams that align in different planes, for example, but do not indicate any required orientation of components with respect to true horizontal and vertical orientation.

Where they are used, the terms "first", "second", and so on, do not necessarily denote any ordinal or priority relation, but are used for more clearly distinguishing one element or time interval from another. There are no fixed "first" or "second" elements in what is taught herein; these descriptors are merely used to clearly distinguish one element from another similar element in the context of the present disclosure. Similarly, filter designations F1, F2, F3, and F4 are assigned to identify different filters in the figures and in the description that follows, and help to identify filter function; no ordinal or priority relation or necessary sequence in the light path is implied in this part numbering.

In the context of the present invention, a surface considered to "reflect" or to be reflective at a certain wavelength reflects at least about 95% of incident light of that wavelength. A surface considered to "transmit" or to be transmissive at a certain wavelength transmits at least about 80% of incident light of that wavelength. Relative to optical filters, the terms "short wave pass", "short wavelength pass", and "SWP" are considered to be equivalent; similarly, terms "long wave pass", "long wavelength pass", and "LWP" are considered to be equivalent.

In the context of the present invention, the phrase "oblique angle" is used to mean a non-normal angle that is slanted to differ from normal, that is, differs from 90 degrees or from an integer multiple of 90 degrees, by at least about 2 degrees or more along at least one axis. An oblique angle may be less than 90 degrees using this general definition.

Embodiments of the present invention provide apparatus and methods for providing laser pump light for a fiber laser or other type of laser as a composite beam formed from light emitted by a plurality of laser sources. Embodiments of the invention further provide filter protection of the pump laser sources from leakage light of the fiber laser or other type of pumped laser.

Referring back to FIG. 1A, the function of filter 30 is to transmit light from the pump light sources, lasers 12a, 12b, and 12c and to block feedback light FB from the high-powered pumped laser. Ideally, all of the pump light is transmitted and all of the feedback light FB is blocked. As is well known to those skilled in the optical arts, high-performance filters that are nearly 100% transmissive over one wavelength range and provide nearly 100% attenuation over a different wavelength range can be costly and have spectral characteristics that often exhibit high levels of ripple at wavelengths removed from sharp edges.

Figure 2A:
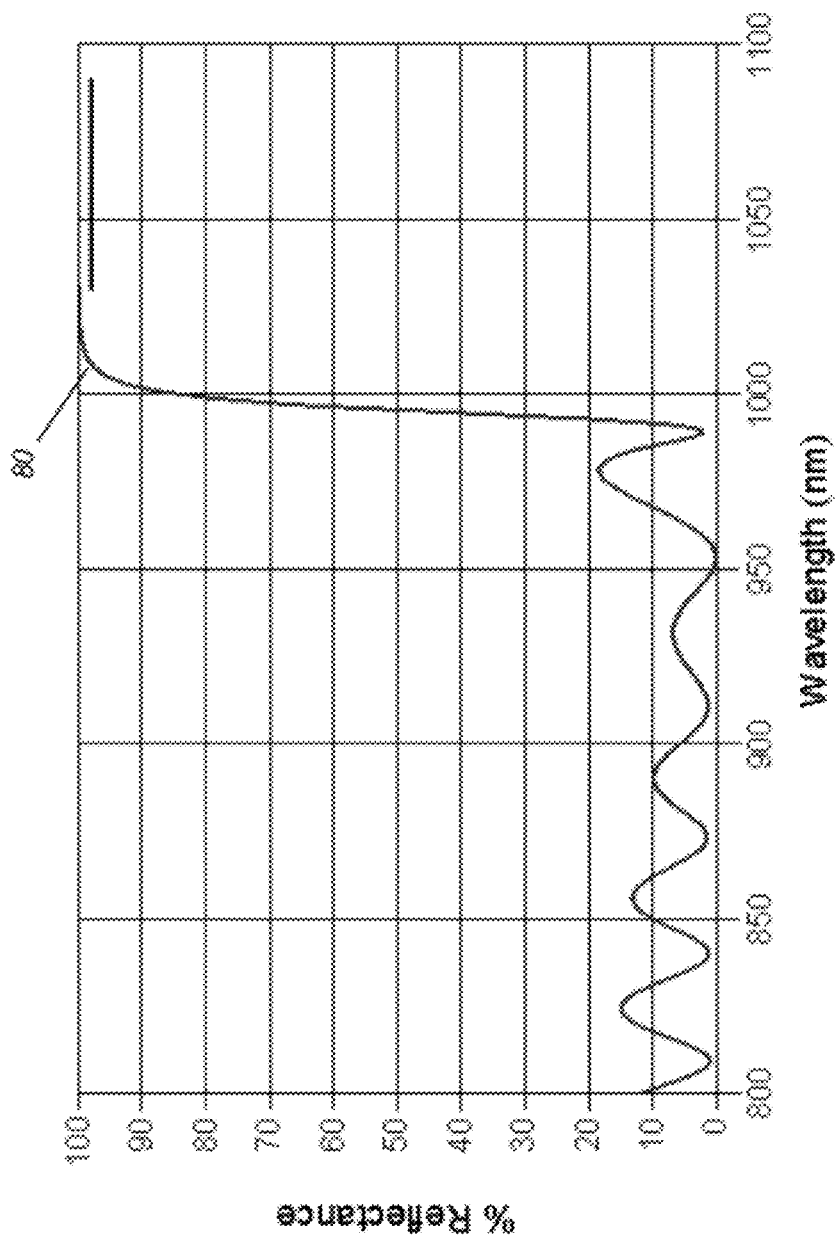
FIG. 2A is a graph that shows a spectral characteristic for a conventional optical filter, showing ripple at wavelengths away from a sharp transition.

By way of example, FIG. 2A shows a spectral characteristic curve 80 for a short wavelength pass filter, plotting percent reflectance against wavelength. Curve 80 shows a steep transition between low reflectance around 990 nm and high reflectance past about 1010 nm. This type of filter could be used, for example, to attenuate feedback light FB from a laser that requires pump light at 990 nm and emits high-power laser light at 1030 nm or higher. In practice, however, the laser pump light for a 1030 nm laser can be at a different wavelength, such as 976 nm in a typical application, more than 50 nm away from the emitted wavelength. Referring again to FIG. 2A, spectral characteristic curve 80 shows almost 20% reflectance for light near 976 nm. Thus, in spite of good levels of rejection of feedback light FB from such a filter, pronounced ripple in spectral characteristic curve 80 also has the unintended effect of attenuating the pump light (976 nm) that is needed for laser excitation.

One way to decrease cost and achieve good performance, while reducing the effects of ripple, is to use a series of lower cost filters in a "stacked" approach that disposes two or more filters in sequence along the optical path. For attenuation, the net effect of stacked filters is multiplicative; where first and second filters each have transmission of 0.01, their stacked combination yields a total transmission of 0.0001. In addition, lower performance filters generally exhibit less pronounced ripple than is shown in the example of FIG. 2A. This stacked filter approach can help to take advantage of lower performance filters; however, it can be impractical for laser pump module design, since it not only adds components to the design, but also requires additional volume or "footprint" for the optical assembly.

Embodiments of the present invention address the problem of efficiently combining laser pump light with an appropriate fill factor for an optical fiber while reducing or eliminating feedback light. These functions are performed using an arrangement of transmissive and reflective filters in a compact package. Advantageously, inventive solutions provided in embodiments of the present invention enable the use of filters that do not require sharp transitions, while providing substantial attenuation of unwanted wavelengths. Further, embodiments of the present invention allow a measure of adjustability for directing light from multiple pump lasers to the aperture of an optical fiber or to the input of some other system that has a limited numerical aperture.

Figure 2B:
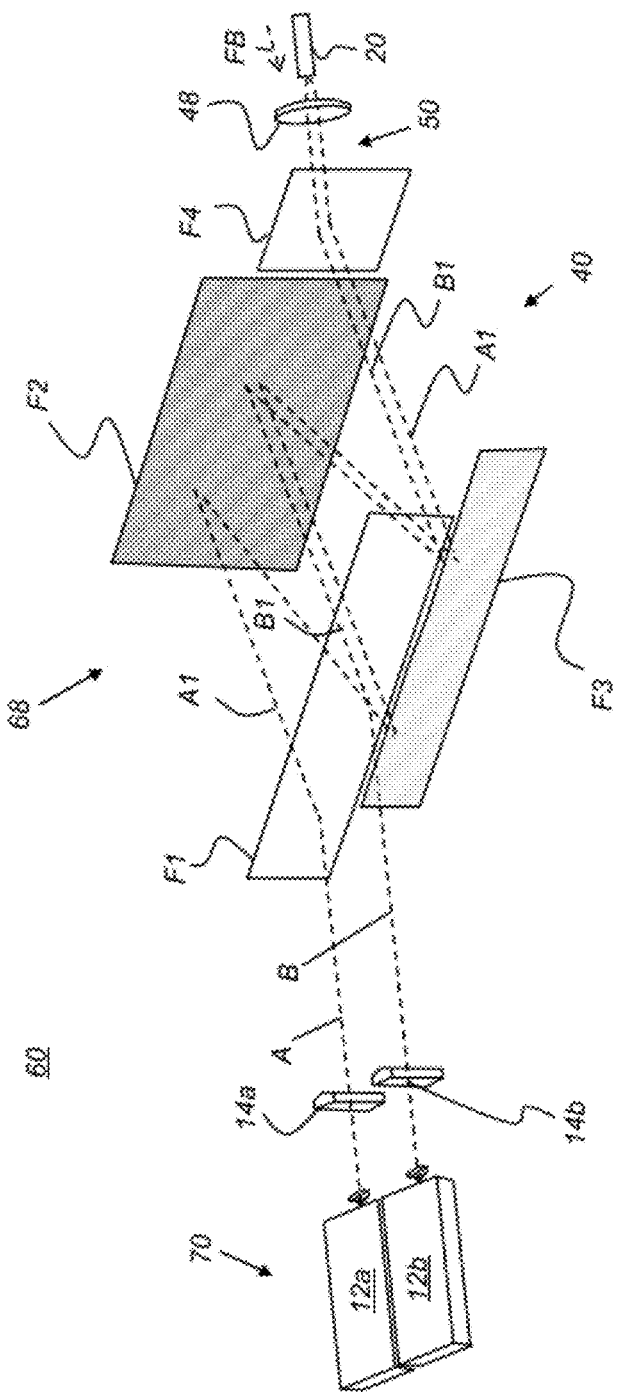
FIG. 2B is a simplified perspective schematic view that shows operating principles of a filter apparatus consistent with an embodiment of the present invention.

The simplified schematic diagram of FIG. 2B shows components of a combining apparatus 60 that uses a filter apparatus 40 and shows the related paths for laser light, with filters that attenuate unwanted wavelengths and realign the light to form a composite light beam 50. Distances between filter surfaces are exaggerated to show principles of light path redirection. For the purpose of showing principles of operation, only two lasers 12a and 12b are shown, each energized to direct light through a cylindrical lens 14a and 14b along a corresponding axis A and B, respectively. Lasers 12a and 12b emit light of wavelength $\lambda 1$, used to provide laser pump light through an optical fiber 20. Filters F1, F2, F3, and F4 are formed and arranged to selectively keep wavelength λ1 within the path shown in FIG. 2B and to remove wavelength λ2 from the path. Filters F1-F4 are formed on surfaces of a transparent refractive body 68, such as a glass plate or block, causing refraction of the light paths so that axis A is refracted to a redirected axis A1 within refractive body 68 and axis B is refracted to a redirected axis B1 within refractive body 68. Optional first filter F1 is a short wavelength pass filter disposed at an oblique angle to the first and second axes A and B and is transmissive to the shorter wavelength λ1 and reflects the longer wavelength λ2. A second filter F2 is spaced apart from and parallel to filter F1. Filter F2 is a long wavelength pass filter that reflects the shorter wavelength λ1 and transmits the longer wavelength λ2. A third long wavelength pass filter F3 is coplanar to optional short wavelength pass filter F1 and reflects λ1 and transmits λ2. A fourth short wavelength pass filter F4 is transmissive to shorter wavelength λ1 and reflects longer wavelength λ2. With proper spacing of components, filter apparatus 40 re-aligns redirected axes A1 and B1, initially aligned along a first plane, along a second plane that is perpendicular to the first plane of axes A and B and extends in parallel to axes A and B. Coplanar has its conventional meaning; parallel first and second thin-film filters can be considered to be coplanar if any layer of the first filter extends along the same plane that contains any layer of the second filter.

In the description and examples given herein, the pump laser 12a, 12b wavelength λ1 is assumed to be less than the pumped laser wavelength λ2. This is typically the case with pump lasers; however, it can be readily appreciated that the filter apparatus 40 of the present invention can be designed for the alternative situation, in which λ1 exceeds λ2, with corresponding changes to filter F1-F4 spectral characteristics. In either situation, filters F1, F2, F3, and F4 can be formed and arranged to selectively keep wavelength λ1 within the path shown in FIG. 2B and to remove wavelength λ2 from the path.

The two-laser model of FIG. 2B can be extended to allow three or more energized lasers to be combined, with filtering to protect the pump lasers from feedback light energy. Referring to the perspective block diagram of FIG. 2C and corresponding top view of FIG. 2D and rear view of FIG. 2E, there is shown a combining apparatus 60 for a laser pump module using filter apparatus 40 consistent with an embodiment of the present invention. Each of pump lasers 12a, 12b, and 12c in a pump laser array 70 emits light toward an incident surface 36 of filter apparatus 40. Pump laser 12a emits along an emission axis A; pump laser 12b emits along an emission axis B; and pump laser 12c emits along an emission axis C. Pump lasers 12a, 12b, and 12c emit light at a first wavelength λ1; this light is used as pump light to a pumped laser 32 that emits light at a second wavelength λ2, shown in FIG. 2D. Pumped laser light is typically at a longer wavelength than the pump light provided. Pumped laser 32 is a fiber laser according to one embodiment of the present invention. The light from each laser 12a, 12b, and 12c is directed through its corresponding cylindrical lens 14a, 14b, and 14c, respectively. Filter apparatus 40 is formed on a transparent body or plate 42, such as a glass plate. The light of first wavelength λ1 is transmitted through optional short wavelength pass filter F1 and enters the refractive material of transparent plate 42. With subsequent reflection between long wavelength pass filters F2 and F3 within filter apparatus 40 and with sequential filtering at short wavelength pass filter F4, the laser beams, initially transmitted in parallel and aligned with each other in a first plane or first direction, are realigned with each other along a second plane or second direction that is substantially orthogonal to the first plane, that is, within about +/−2 degrees from orthogonal. Any stray feedback light FB from pumped laser 32, at second wavelength λ2, is removed from the light path within filter apparatus 40 by reflection from short wavelength pass filter F4, transmission through long wavelength pass filters F3 and F2, and reflection from optional short wavelength pass filter F1. This rejection of feedback light FB emulates the protective effect of multiple stacked filters using the surfaces of filter apparatus 40.

Figure 2C:
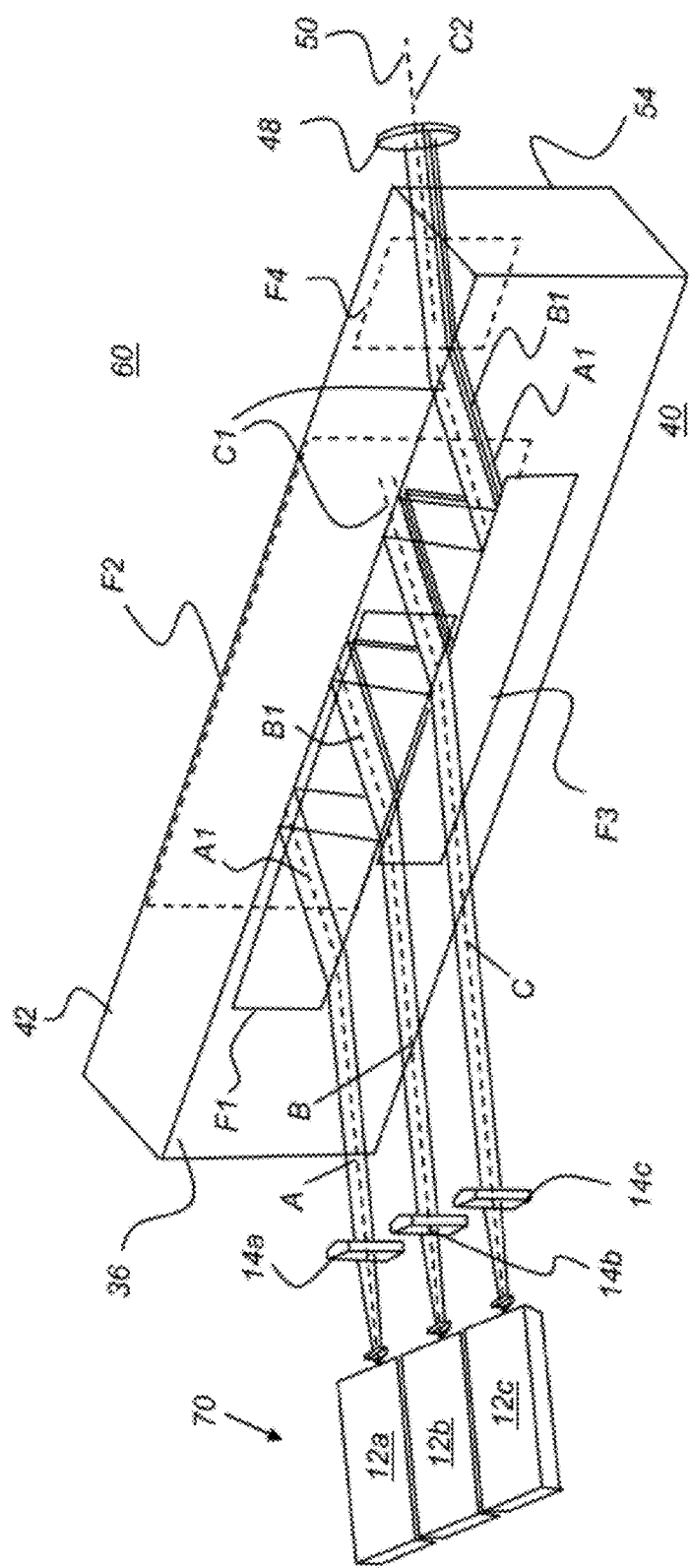
FIG. 2C is a perspective schematic view that shows an apparatus for combining light using a filter apparatus and shows light paths according to an embodiment of the present invention.
Figure 2D:
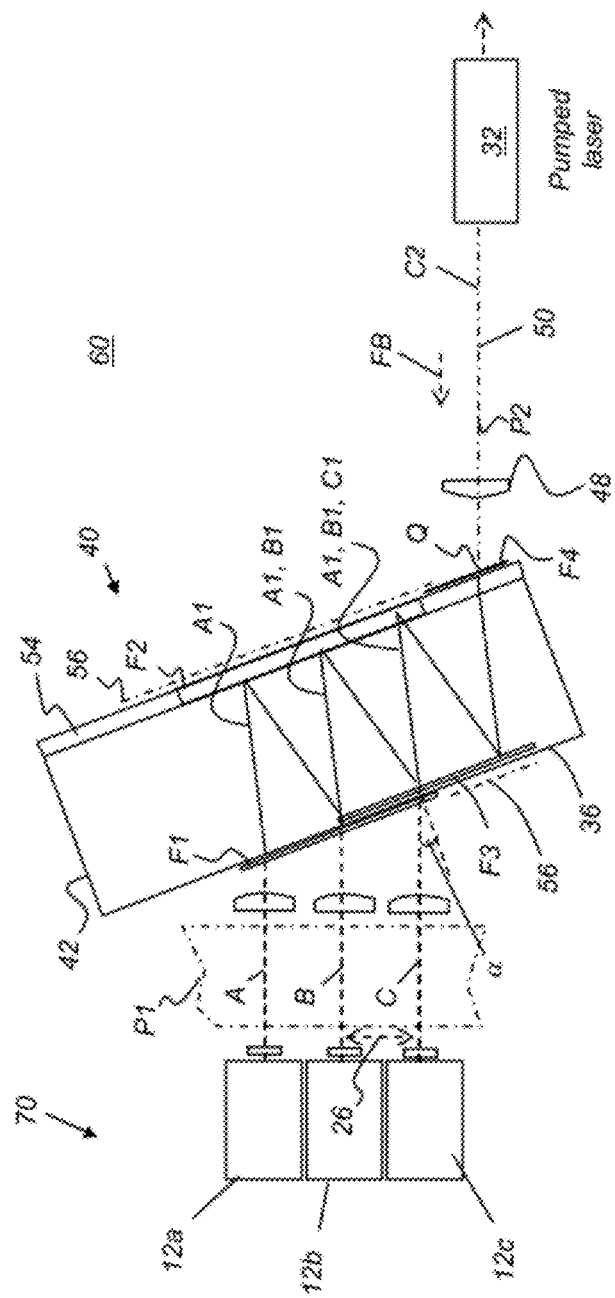
FIG. 2D is a top view of the apparatus for combining light shown in FIG. 2C.

In the top view of FIG. 2D, the axes of emitted laser beams are aligned along a first direction that defines a first plane P1 that contains axes A, B, and C (the first plane being a generally horizontal plane in the view of FIG. 2C and lying in the plane of the page in FIG. 2D). Emission axes A, B, and C are equidistant from each other in plane P1, separated by an inter-axis distance 26 as shown in FIG. 2D. At the output of filter apparatus 40, the combined beams are re-aligned in a second, orthogonal direction, that is, with axes aligned along an orthogonal plane P2 (extending orthogonally outward from the page as shown in FIG. 2D and represented in FIG. 2E) and wherein the distance between axes for the filtered and combined light in plane P2 is less than inter-axis distance 26 for incident light in plane P1. The combined beams form composite light beam 50 along a composite axis C2. The component beams are spaced apart in this direction, as was shown in inset W in the example of FIG. 1A. With respect to FIG. 2D and similar top view figures that follow, filters F1 and F3 may be shown offset from each other to allow better visibility. In embodiments of the present invention, filters F1 and F3 are coplanar.

Figure 2E:
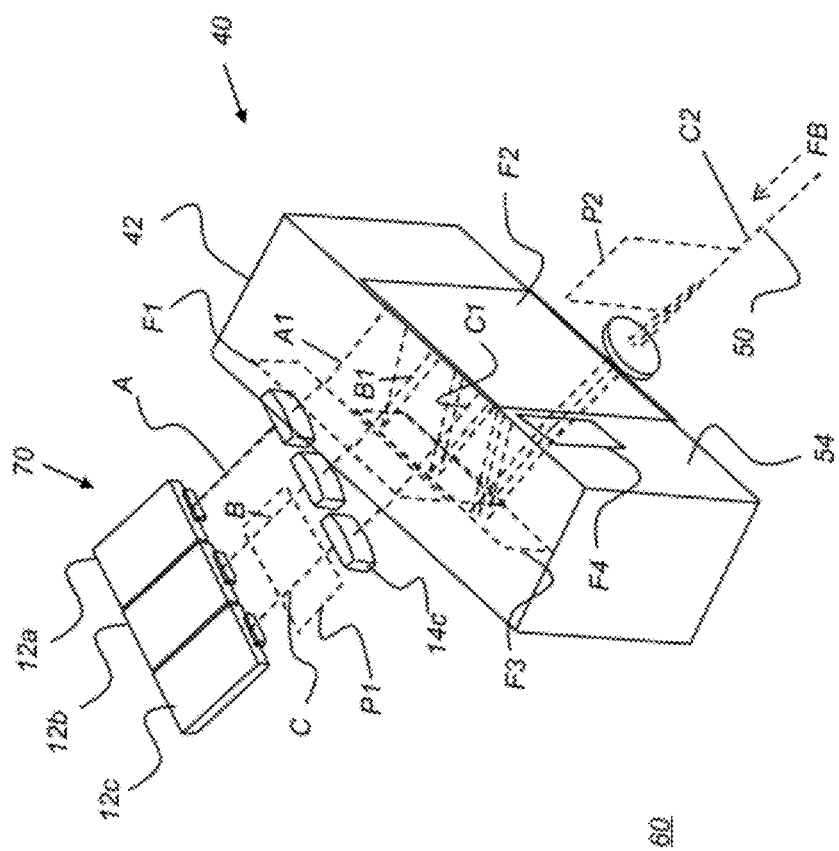
FIG. 2E is a rear view of the apparatus for combining light shown in FIG. 2C.

Thus, following the basic pattern described with reference to FIG. 2B, FIG. 2C and the top and rear views of FIGS. 2D and 2E show how the light beams in combining apparatus 60 are successively shifted within filter apparatus 40 and directed from one filter to the next. Light along axis A is refracted and travels within plate 42 or other refractive body along a redirected axis A1 toward rear long wavelength pass filter F2 formed on a rear surface 54. Light along axis A1, at the first wavelength λ1 emitted from laser 12a, reflects from long wavelength pass rear filter F2 toward long wavelength pass front filter F3. Axis A1 is then incident on front filter F3, just below the entry point of light from laser 12b, again of the first wavelength λ1, along axis B. Both rear filter F2 and front filter F3 are treated or otherwise formed to reflect light of wavelength λ1 from light sources 12a-12c back into filter apparatus 40 and to transmit light of the emitted laser wavelength λ2 from pumped laser 32 out from filter apparatus 40. As shown in FIG. 2C, the light along axis B is incident on plate 42 at a position just above or past an edge of long wavelength pass front filter F3. Refraction by plate 42 then redirects the incident light from axis B to a redirected axis B1 that is aligned with redirected axis A1, wherein the alignment direction for axes A1 and B1 is orthogonal to the initial alignment direction (plane P1) for axes A, B, and C.

Continuing with the light path description shown in FIGS. 2C, 2D, and 2E, light axes A1 and B1 for light of the first wavelength λ1 reflect from long wavelength pass rear filter F2 back toward front filter F3. Axes A1 and B1 now reflect from long wavelength pass front filter F3, just below the entry point of light from laser 12c along axis C. Again as shown in FIG. 2C, the light along axis C is incident on plate 42 at a position just above or past an edge of front filter F3. Refraction by plate 42 then redirects the incident light from axis C to a redirected axis C1 that is aligned with redirected axes A1 and B1, wherein the alignment direction for axes A1, B1, and C1 is orthogonal to the initial alignment direction (plane P1) for axes A, B, and C. In the three laser embodiment of FIGS. 2C, 2D, and 2E, the light of wavelength λ1 along redirected axes A1, B1, and C1 is again reflected from long wavelength pass rear filter F2 to front filter F3 and exits plate 42 through short wavelength pass filter F4, forming composite light beam 50 thereby. Optional lens 48 focuses composite light beam 50 toward an optical fiber or other device for direction to pumped laser 32, as was shown in FIG. 1A.

Following each light path in the embodiment shown in FIGS. 2C-2E, it can be seen that each light path encounters all four filters F1-F4. The incident light from each of laser sources 12a-12c is incident once on each of short wavelength pass filters F1 and F4. The C-C1 light path from laser 12c is also incident once upon long wavelength pass rear filter F2 and once upon long wavelength pass front filter F3. The B-B1 light path from laser 12b is incident twice upon long wavelength pass rear filter F2 and twice upon long wavelength pass front filter F3. The A-A1 light path from laser 12a is incident thrice upon long wavelength pass rear filter F2 and thrice upon long wavelength pass front filter F3. It can be appreciated that with this arrangement, feedback light FB from the pumped laser can be greatly reduced and substantially eliminated from reaching the pump lasers. Thus, the arrangement of the four filters F1-F4 shown in FIG. 2B effectively provides stacked-filter performance for any number of lasers. As noted earlier, short wavelength pass filter F1 is optional. In an alternate embodiment, only one short wavelength pass filter is provided, which may be at the position shown for either filter F1 or filter F4 in FIGS. 2B-2E. Where short wavelength pass filter F1 is not used, an anti-reflection (AR) coating is generally provided on the corresponding surface.

FIG. 2A showed the problem that can occur when using a filter having a relatively sharp transition over a small range of wavelengths. Using the embodiment of FIG. 2B-2E, it is instructive to consider how the stacked-filter effect that is provided by filter apparatus 40 attenuates unwanted feedback FB light even where long wavelength pass filters F3 and F2 are of moderate quality.

Figure 3B:
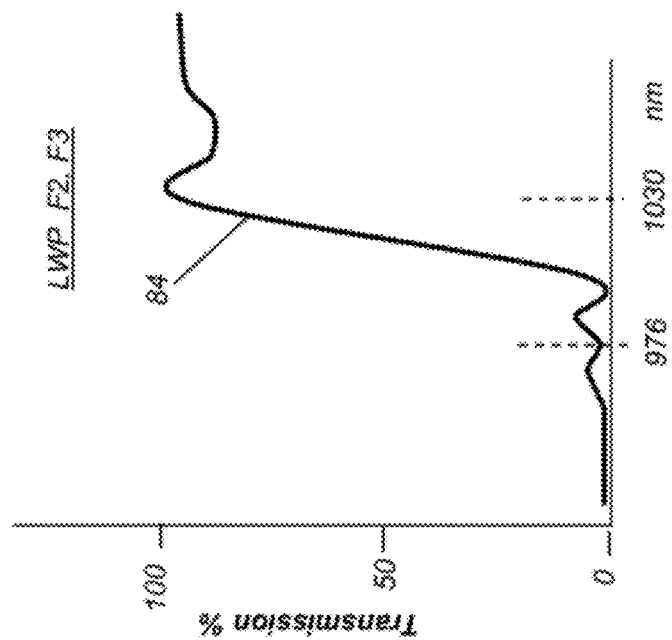
FIG. 3B is a graph showing a spectral characteristic curve for long wavelength pass filters in the filter apparatus of FIGS. 2B-2E consistent with one embodiment of the present invention.
Figure 3A:
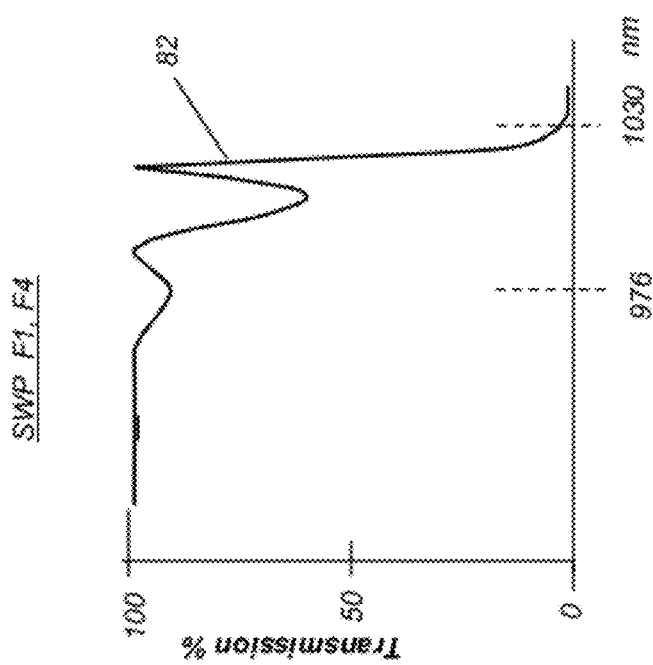
FIG. 3A is a graph showing a spectral characteristic curve for short wavelength pass filters in the filter apparatus of FIGS. 2B-2E consistent with one embodiment of the present invention.

Referring to FIG. 3A, a spectral characteristic curve 82 for short wavelength pass (SWP) filters F1 and F4 is shown, relative to transmission, consistent with an embodiment of the present invention. As curve 82 shows, there is some transmission of the unwanted 1030 nm feedback light FB. However, in an embodiment wherein there are two of these short wavelength pass filters in the light path, even if each filter allowed 3% transmission (0.03), the percentage of light of 1030 nm that would be transmitted through the two short wavelength pass filters F1 and F4 would be: $(0.03)^2 = 0.0009$ or 0.09%

Referring to FIG. 3B, a spectral characteristic curve 84 for long wavelength pass (LWP) filters F2 and F3 is shown, again relative to transmission, consistent with an embodiment of the present invention. As curve 84 shows, there is still some reflection of the unwanted 1030 nm feedback light FB. However, the stacked filter effect also works to advantage here. Considering the example system of FIG. 2C, where front and rear long wavelength pass filters F3 and F2 attenuate FB light by transmitting 96% of this light, and short wavelength pass filters F1 and F4 attenuate FB light by reflecting 97% of the light, the percentage of FB light that could be received by pump laser 12c is the product:

$$(0.04)^2(0.03)^2 = 0.00000144 \text{ or } 0.000144\%$$

The percentage of FB light that could be received by pump laser 12b is as follows:

$$(0.04)^4(0.03)^2 = 2.304\,E{-}7 = 0.0000002394 \text{ or } 0.00002394\%$$

The percentage of FB light that could be received by pump laser 12a is as follows:

$$(0.04)^6(0.03)^2 = 3.6864\,E{-}12 = 0.0000000000036864 \text{ or } 0.00000000036864\%$$

Thus, it can readily be seen that filter apparatus 40 provides significant advantages for attenuating stray feedback light from the pumped laser, essentially reducing any feedback light FB to negligible levels, thereby helping to protect against damage to pump lasers 12a-12c. High levels of attenuation to feedback light FB are provided by stacking the filters in this arrangement, so that even using filters with moderate individual performance, their combination provides a resulting spectral characteristic that can exceed what is feasible using a single filter.

FIG. 2D also shows positions for an optional absorber 56 that is provided, as a type of light dump component for absorbing stray feedback light FB from pumped laser 32. One absorber 56 is disposed near the rear surface 54 for absorbing light transmitted through long wavelength pass rear filter F2. Another absorber 56 is shown disposed near incident surface 36, aligned with the top edge of a portion of long wavelength pass front filter F3. Absorber 56 can be formed onto the rear surface of either long wavelength pass filter F3 or F2 or may be a separately formed and disposed alongside and spaced apart from filter apparatus 40 surfaces.

Still referring to FIG. 2D, absorber 56, intended to absorb feedback light FB from the pumped laser 32 that is inadvertently transmitted through front and rear filters F3 and F4, would receive a higher proportion of energy from the feedback light FB nearer the point of exit Q of the pump light. After repeated attenuation by long wavelength pass filters F3 and F2, only a negligible component of feedback light FB is likely to be transmitted through surfaces 36 or 54 further away from point of exit Q, for example. Thus, absorber 56 may not extend the full length of filters F3 and F2, or may be of variable thickness depending on its distance from point Q, for example.

As FIGS. 2C-2E show, light is directed toward filter apparatus 40 at oblique angles of incidence. Oblique incidence within the plane defined by at least axes A and B, plane P1 in FIG. 2D, provides refractive re-direction of light along each axis, so that light that is reflected from long wavelength pass filters F3 and F2 from a first axis aligns with incident light along the adjacent axis. The angle designated at α along axis C in FIG. 2D is shown with respect to normal to surface 36 and is between incident surface 36 and any of the incident axes A, B, and C, lying within plane P1. In the context of the present disclosure, this incident angle α is considered to be the in-plane angle.

Figure 4:
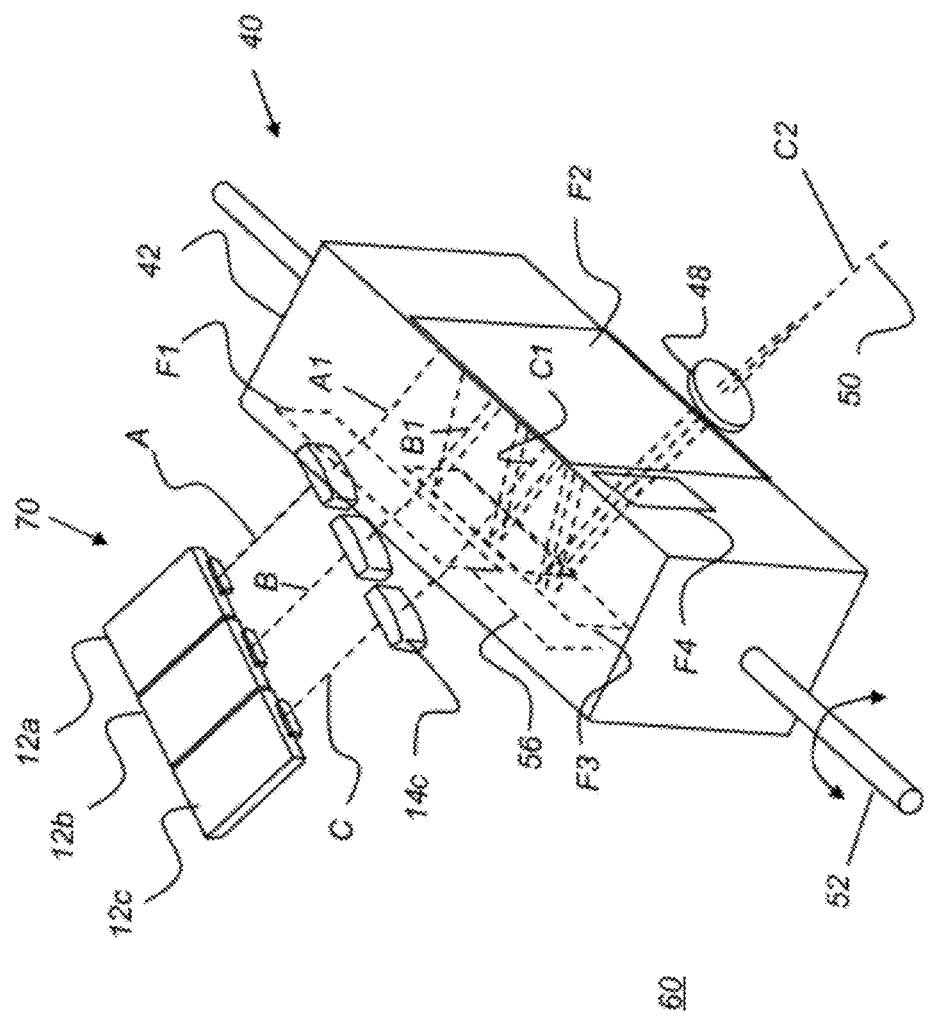
FIG. 4 is a perspective view of the apparatus for combining light using a filter apparatus, showing a tilt axis for adjusting distance between component light beams.

In addition to oblique incidence relative to incoming light in the plane P1, filter apparatus 40 also has a measure of tilt with respect to an axis that is parallel to plane P1. Advantageously, this tilt is adjustable and gives filter apparatus 40 its capability to control the aspect ratio of composite light beam 50. This adjusts the distance between component light beams, shown in FIG. 1A as dead space 24. The perspective view of FIG. 4 shows a tilt axis 52 for adjusting tilt. Tilt axis 52 is parallel to the plane that contains light axes A, B, and C (plane P1 in FIGS. 2D and 2E). Rotation about tilt axis 52 changes the angle of incidence of incident surface 36 relative to the light along axes A, B, and C and effects corresponding changes in the angles at which light of wavelength λ1 is reflected from front and rear long wavelength pass filters F3 and F2. In one embodiment, mounting hardware provided with filter apparatus 40 allows rotational adjustment about tilt axis 52, such as during initial alignment and setup of combining apparatus 60. One or more of absorbers 56 may also rotate about tilt axis 52 as filter apparatus 40 is rotated.

Figure 5:
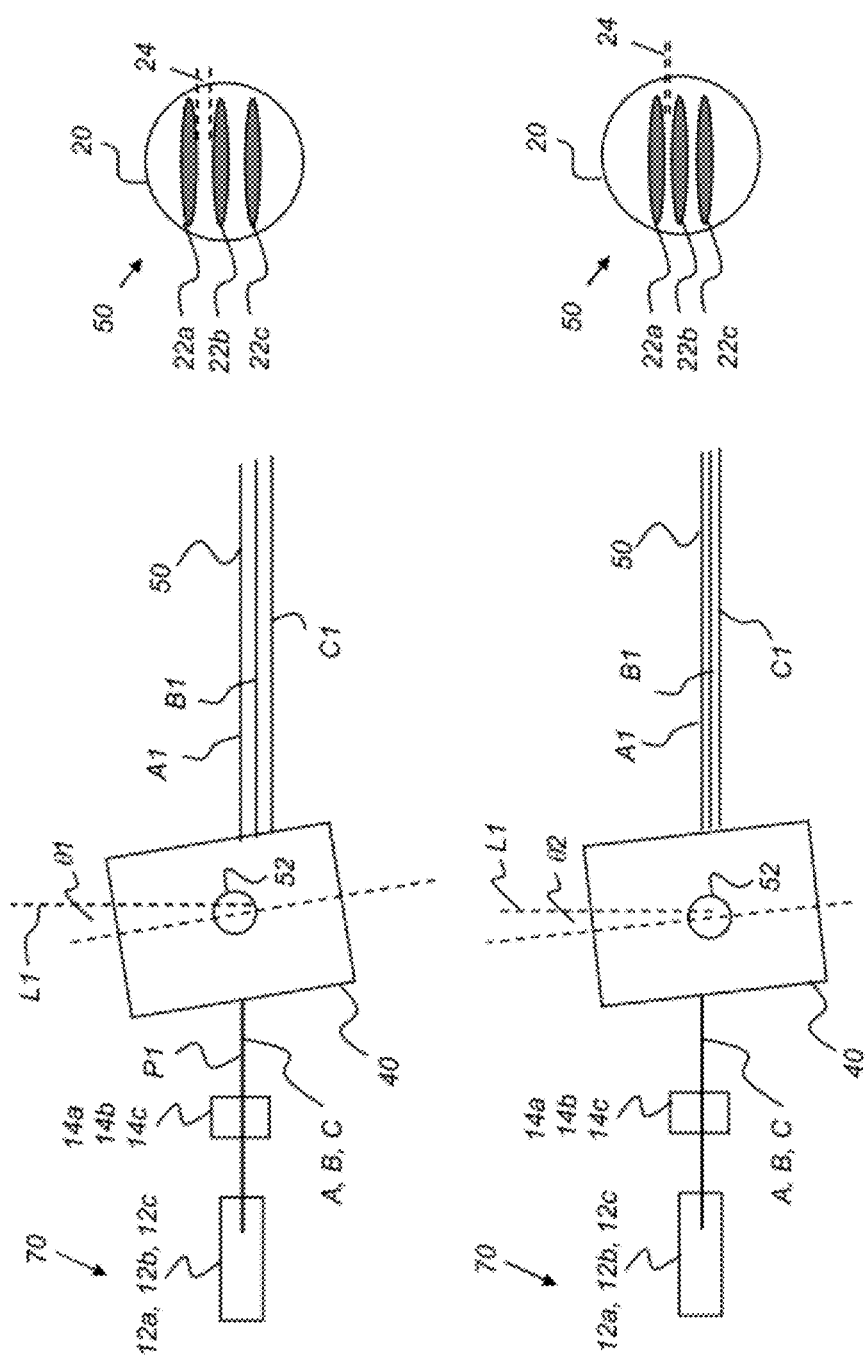
FIG. 5 is a block diagram in cross-section that shows the affect of tilt angle on the spacing and aspect ratio of the composite light beam.

The cross-sectional views of FIG. 5 show the effect of tilt about tilt axis 52 on component beam 50. At a first tilt angle θ1 at the top of FIG. 5, wherein tilt angle θ1 is with respect to a normal (vertical in the FIG. 5 representation), output beams 22a, 22b, and 22c are spaced apart by the amount of dead space 24 as shown. Tilting to a smaller tilt angle θ2, as shown in the lower portion of FIG. 5, decreases the amount of dead space 24 between output beams 22a, 22b, and 22c accordingly. This changes the aspect ratio of beam 50, which can be expressed as the ratio of x to y or height to width, for example, of the composite light beam formed by filter apparatus 40. By way of reference, tilt angles θ1 and θ2 are with respect to a perpendicular to plane P1 of FIG. 2D, with the perpendicular shown as dotted line L1 in FIG. 5. Plane P1 is orthogonal to the page and along the A, B, C axes in the cross-sectional view of FIG. 5.

Figure 6B:
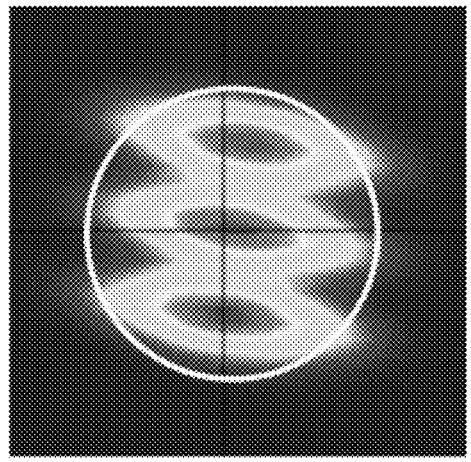
FIGS. 6A and 6B are cross-sectional views of the spatial profile of the composite output beam with a filter apparatus at two alternate tilt angles.
Figure 6A:
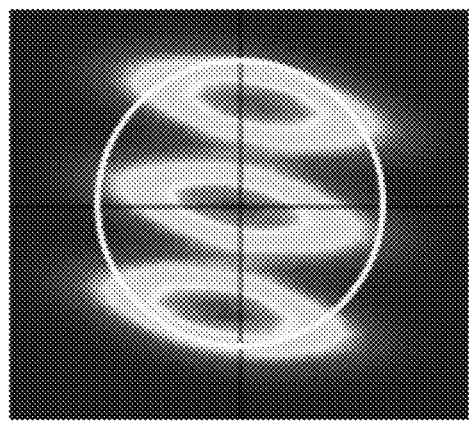

As shown in FIG. 5, the capability to change the aspect ratio with a single tilt adjustment is advantaged for shaping composite light beam 50 for input to optical fiber 20 or other optical device. By way of example, FIGS. 6A and 6B show measured spatial distributions of energy intensity from a three-laser apparatus using filter apparatus 40 at two different tilt angles. As FIG. 6B shows, the use of a smaller tilt angle θ compresses or eliminates the dead space between component output beams. By way of comparison, a circle in each of FIGS. 6A and 6B indicates the approximate numerical aperture (N.A.) of an optical fiber.

Figure 7:
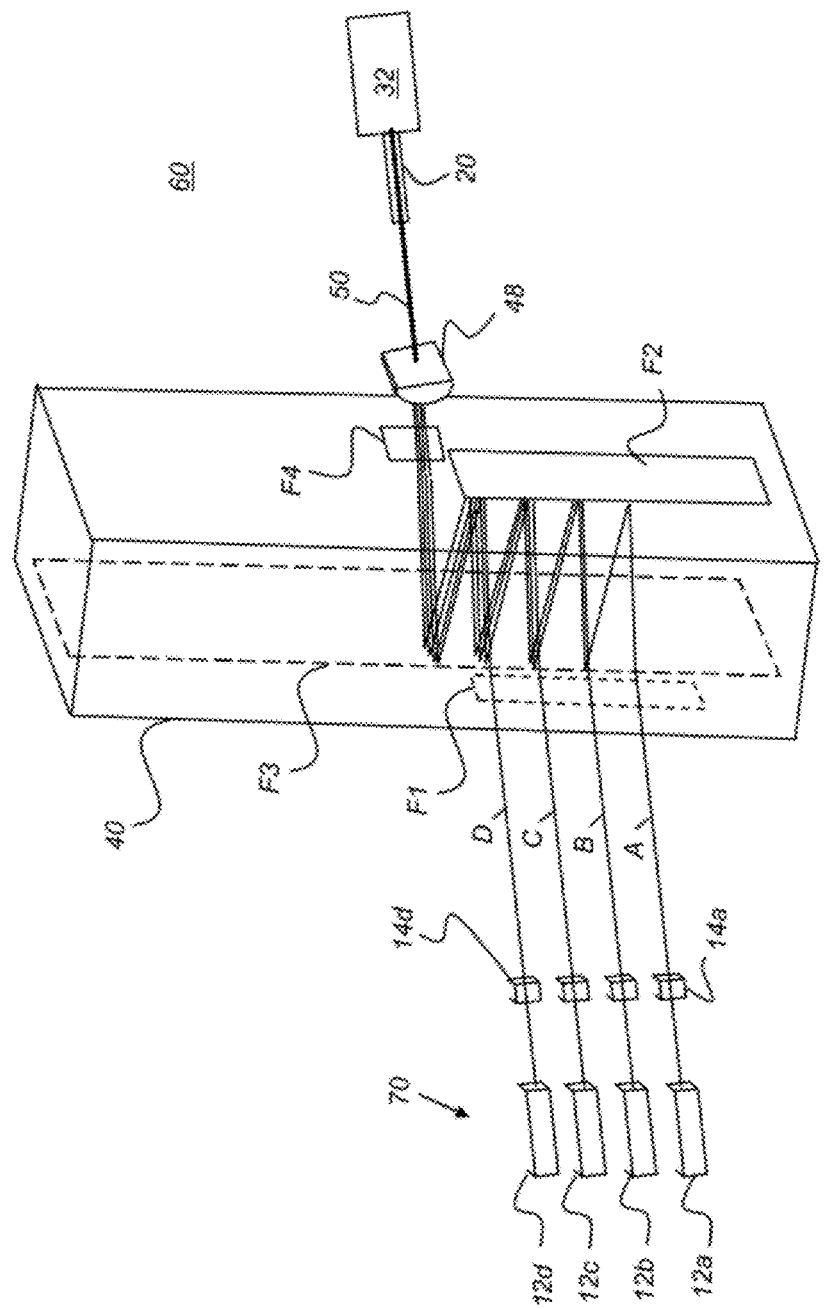
FIG. 7 is a perspective view showing an alternate embodiment in which a combining apparatus has more than three laser light sources.
Figure 8:
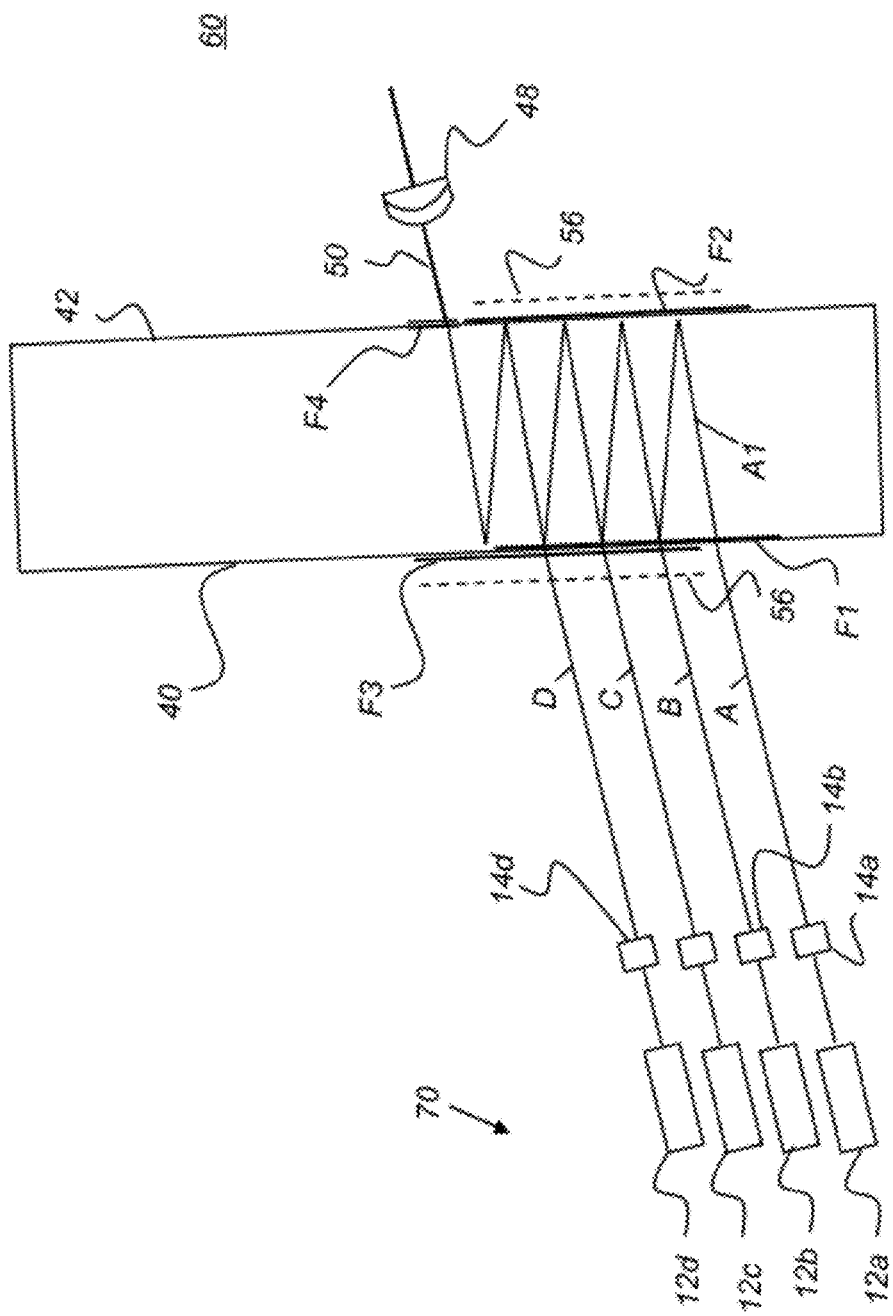
FIG. 8 is a top view showing light paths in the alternate embodiment of FIG. 7.

A further advantage when using filter apparatus 40 with filters F1-F4 relates to the capability to use more than 3 lasers, as is the current limitation with conventional devices such as that described previously with respect to FIGS. 1A and 1B. Referring to the perspective view of FIG. 7 and the side view of FIG. 8, combining apparatus 60 has four lasers 12a, 12b, 12c, and 12d in pump laser array 70. Each laser 12a, 12b, 12c, and 12d has a corresponding cylindrical lens 14a, 14b, 14c, and 14d. As visually represented from this alternate angle, the light axes A, B, C, and D are aligned vertically at the input surface of filter apparatus 40 and re-aligned horizontally in composite light beam 50. Optional absorbers 56, not shown in the view of FIG. 7 for clarity, may also be provided in this embodiment.

Figure 9:
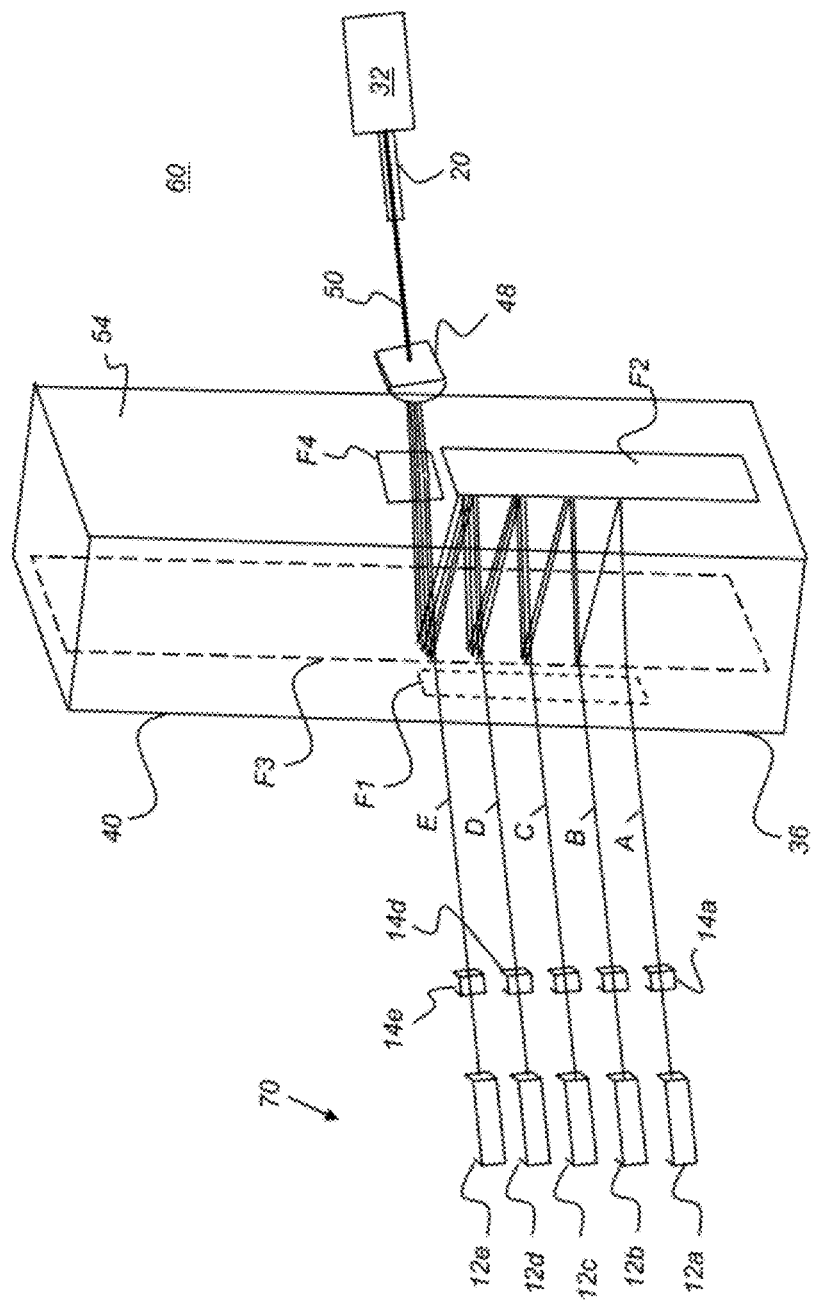
FIG. 9 is a perspective view showing an alternate embodiment in which a combining apparatus has more than three laser light sources.
Figure 10:
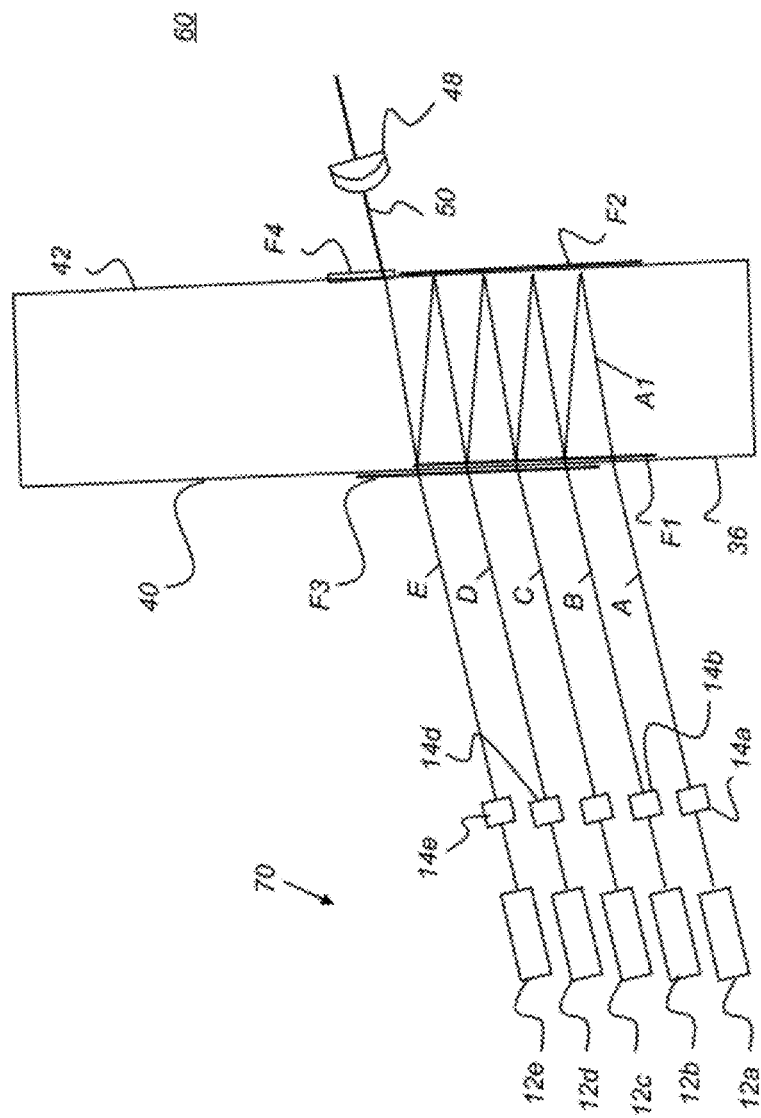
FIG. 10 is a top view showing light paths in the alternate embodiment of FIG. 9.

It can be appreciated that additional lasers, in excess of 4, could be added using filter apparatus 40 with filters F1-F4, with appropriate dimensioning of front and rear long wavelength pass filters F3 and F2. FIGS. 9 and 10 show perspective and side views, respectively, of combining apparatus 60 having five lasers 12a, 12b, 12c, 12d, and 12e in pump laser array 70. Each laser 12a, 12b, 12c, 12d, and 12e has a corresponding cylindrical lens 14a, 14b, 14c, 14d, and 14e and directs light along its corresponding axis A, B, C, D, or E. In the embodiment of FIGS. 9 and 10, laser 12e is not protected by long wavelength pass filters F3 and F2. This is a possible embodiment, but requires that short wavelength pass filter F4 and optional short wavelength pass filter F1 have high rejection for feedback light of laser wavelength λ2.

Figure 11:
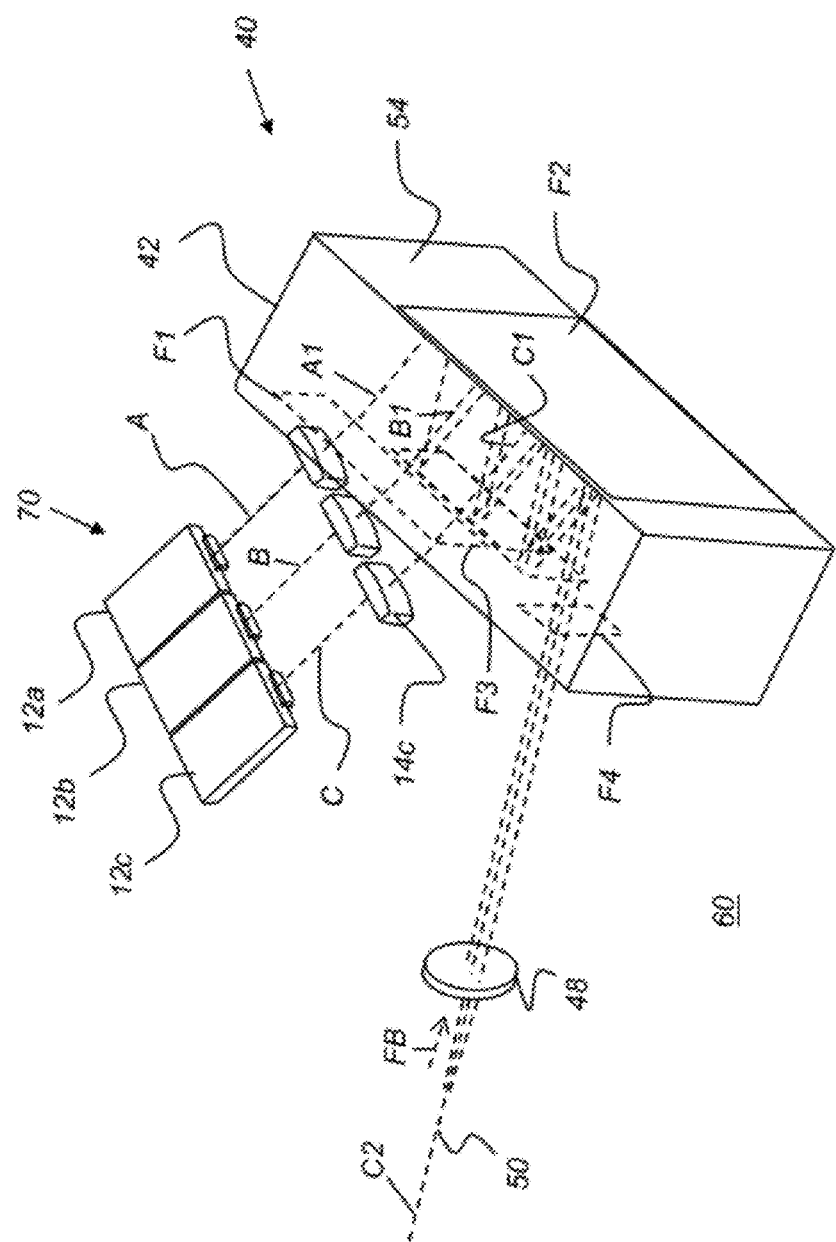
FIG. 11 is a perspective view that shows an alternate version having a reflected output beam.

The perspective view of FIG. 11 shows an alternate embodiment, in which the output composite light beam 50 is reflected from long wavelength pass rear filter F2, and wherein short wavelength pass filter F4 is coplanar with short wavelength pass filter F1 and long wavelength pass filter F3. In this embodiment, rear surface 54 can be partially or fully coated as long wavelength pass filter F2. Short wavelength pass filters F1 and F4 could optionally be combined to form a single filter that is of sufficient length for filtering incident and output light. This embodiment can provide stacked-filter emulation in the same manner as that described for the embodiment of FIGS. 2C-2E and may have advantages for packaging and light path folding. However, this embodiment would not allow adjustment of the aspect ratio of composite light beam 50 without also changing the angle of output composite axis C2 (with respect to vertical plane P2).

Figure 1B:
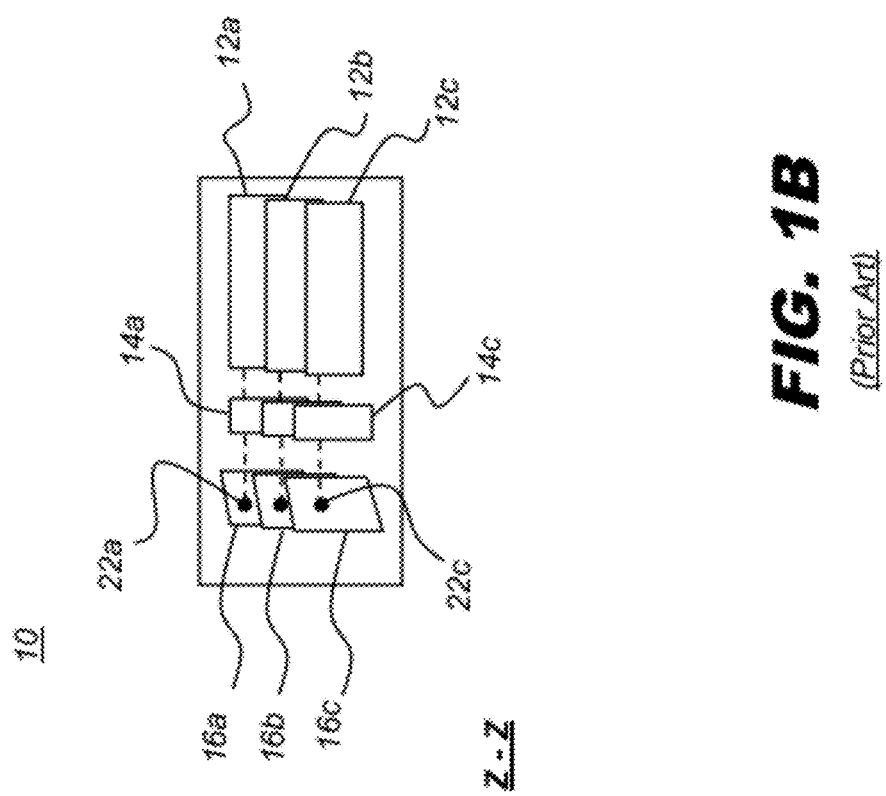
FIG. 1B is a side view block diagram of the conventional laser pump module shown in FIG. 1A for combining lasers to provide a composite beam.

Combining apparatus 60 of the present invention provides a number of features and advantages over conventional solutions for combining multiple laser sources to form a single composite light beam. These advantages include:

(i) Positioning of lasers along the same plane and directed in parallel, allowing the use of a laser array and simplifying laser alignment from the stepped-height requirements for earlier laser diode arrangements, such as those described with reference to FIG. 1B.
(ii) Use of a low-cost transparent plate, such as a glass plate with filter coatings. The use of thin-film coatings allows a very sharp edge to be presented to incoming light beams, reducing scatter and other effects.
(iii) Adjustable aspect ratio, as described earlier with respect to FIGS. 4 through 6B.
(iv) Scalable, with a variable number of lasers, from two or more lasers, including embodiments using 4 or more lasers as described with reference to FIGS. 7 and 8.
(v) Improved thermal stability, since all pump lasers direct light through the same filter components.
(vi) Built-in protection from interfering wavelengths of light, particular from leakage light emitted from the pumped laser.
(vii) Simplified fabrication and alignment.
(viii) Improved component life. This applies both to the pump lasers themselves and to filter surfaces F1, F2, F3, and F4, over conventional single-filter or stacked-filter arrangements. Thin-film filters, for example, are advantaged over other filter types for having high damage thresholds from laser light.

Fabrication

Transparent plate 42 of filter apparatus 40 is typically a glass plate, selected for suitability with the intended laser wavelengths. Other transparent materials can be used, including crystalline materials and plastics, for example. Conventional mounting techniques can be used to position filter apparatus 40 at a suitable oblique in-plane angle α with respect to the emitted laser beams, as was described earlier with reference to FIGS. 2C and 2D. In-plane angle α is determined by the index of refraction n of the selected glass or other transparent block of material used for transparent plate 42 or other transparent body.

Front and rear long wavelength pass filters F3 and F2 are formed or otherwise treated to reflect light of a first, shorter wavelength λ1, here, the pump light wavelength, and to transmit light of a second longer wavelength λ2, here, the pumped laser wavelength. Filters F3 and F2 can be formed from dichroic coatings in one embodiment, advantageously providing a very thin surface with high filter selectivity, reflectivity, and transmission characteristics. The design of thin-layer dichroic coatings for providing a given spectral characteristic is known to those skilled in the thin-film design arts and typically involves beginning with an approximate design and iteratively proceeding through a series of optimizations until the desired spectral characteristic is achieved.

An adjustable mechanism can be provided to allow adjustment of tilt angle, described as tilt angles θ1 and θ2 in FIG. 5. The adjustment can be manually performed or provided using a motor or other automated device. A lock-down apparatus can be provided for securing a tilt adjustment.

Filter apparatus 40 of combining apparatus 60 combines two or more laser beams to be directed along a single output axis as described hereinabove, and is particularly well suited for combining pump laser light from laser diodes, for which the emitted light beam is elongated on one axis, allowing these beams to be stacked together to form a composite light beam of variable aspect ratio. Embodiments of the present invention given hereinabove describe the use of filter apparatus 40 for combining beams that are generated simultaneously. As is readily apparent to one skilled in the optical arts, the combining action of filter apparatus 40 can alternately be used to direct light from any non-empty proper subset of a set that has a plurality of lasers that have emission axes along the same plane. Thus, for example, it may be useful to use a single pump laser for transmission at one power level, and two lasers for pump light transmission at a higher power level. Alternately, lasers of different wavelengths could be selected for transmission along axis C2.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. The invention is defined by the claims.

Thus, what is provided is an apparatus and method for combining laser light, particularly well suited for use with a laser pump source and other combining applications using solid-state laser sources.

The invention claimed is:

1. An apparatus for providing a pump light of a first wavelength $\lambda 1$ to a laser that emits a second wavelength $\lambda 2$, comprising:
   a first laser of the first wavelength $\lambda 1$ that is energizable to direct light along a first axis in a first direction;
   a second laser of the first wavelength $\lambda 1$ that is energizable to direct light along a second axis parallel to the first axis,
   wherein the first and second axes define a first plane P1; and
   a filter apparatus that is disposed to form a composite light beam of the first wavelength $\lambda 1$, the filter apparatus formed on a transparent body that is disposed in the path of the directed light and having:
   (i) a first filter that is formed on a first surface of the filter apparatus that is disposed at an oblique angle to the first and second axes and that is transmissive to $\lambda 1$ and reflects $\lambda 2$;
   (ii) a second filter that is formed on a second surface of the filter apparatus that is parallel to the first surface, wherein the second filter reflects $\lambda 1$ and transmits $\lambda 2$;
   (iii) a third filter that is formed on the first surface of the filter apparatus, coplanar with the first filter, and wherein the third filter reflects $\lambda 1$ and transmits $\lambda 2$;
   wherein the filter apparatus re-aligns the first and second axes along a second plane P2 that is orthogonal to P1 and parallel to the first direction.

2. The apparatus of claim 1 further comprising a fourth filter that is formed on the second surface of the filter apparatus and that is transmissive to $\lambda 1$ and reflects $\lambda 2$.

3. The apparatus of claim 1 wherein the first and second surfaces of the filter apparatus are substantially parallel.

4. The apparatus of claim 1 wherein the filter apparatus further has a tilt axis that is parallel to the first plane P1 and wherein rotation about the tilt axis adjusts a distance in the second plane P2 between the re-aligned first and second axes.

5. The apparatus of claim 1 wherein at least one of the filters is a dichroic filter.

6. The apparatus of claim 1 further comprising a third laser of the first wavelength $\lambda 1$ that is energizable to direct light along a third axis parallel to the first axis and wherein the second filter further reflects light from the first and second lasers to be aligned with light from the refractively redirected third axis.

7. The apparatus of claim 1 further comprising one or more absorbers disposed alongside the first surface, the second surface, or both.

8. The apparatus of claim 1 further comprising a lens that directs the composite light beam toward an optical fiber.

9. The apparatus of claim 1 wherein the first and second wavelengths differ by more than about 50 nm.

10. The apparatus of claim 1 wherein the first filter is a short wavelength pass filter and the second and third filters are long wavelength pass filters.

11. The apparatus of claim 1 wherein
   (i) said first filter formed on said first surface of the filter apparatus that is disposed at an oblique angle to the first and second axes and that is transmissive to $\lambda 1$ and reflects $\lambda 2$ is a first short wavelength pass filter;
   (ii)) said second filter formed on said second surface of the filter apparatus that is parallel to the first surface, is a first long wavelength pass filter, said the first long wavelength pass filter reflects $\lambda 1$ and transmits $\lambda 2$;
   (iii) said third filter is a second long wavelength pass filter wherein the second long wavelength pass filter reflects $\lambda 1$ and transmits $\lambda 2$.

12. The apparatus of claim 1 wherein
   said third filter (F3) is coplanar to a first filter (F1), said apparatus further comprising
   a fourth filter (F4) that is transmissive to $\lambda 1$ and reflects $\lambda 2$.

13. The apparatus of claim 12 wherein the filter apparatus further has a tilt axis that is parallel to the first plane P1 and wherein rotation about the tilt axis adjusts a distance in the second plane P2 between the re-aligned first and second axes.

14. The apparatus of claim 12 further comprising one or more absorbers disposed alongside the first surface of the filter apparatus, the second surface, or both.

15. The apparatus of claim 12 wherein at least one of the filters is a dichroic filter.

16. An apparatus for coupling pump light of a first wavelength $\lambda 1$ from a plurality of laser sources to an optical fiber, according to claim 1, further including:
   one or more absorbers disposed alongside at least a portion of one or more of the first and second surfaces for absorbing light of the second wavelength $\lambda 2$; and;
   a combiner lens that is disposed to direct the composite light beam toward the optical fiber; and wherein:
   a tilt axis that is parallel to the first plane P1 and rotatable to adjust a distance in the second plane P2 between the aligned reflected, redirected first axis and the redirected second axis.

17. The apparatus of claim 16 wherein the second wavelength $\lambda 2$ is emitted from a pumped laser and where the first wavelength $\lambda 1$ and the second wavelength $\lambda 2$ differ by more than about 50 nm.

18. The apparatus of claim 16 wherein the first and second axes are equidistant from each other by a first distance and wherein the re-aligned axes are equidistant from each other by a second distance that is less than the first distance.

19. A method for providing a composite light beam as pump light of a wavelength $\lambda 1$ to a pumped laser that emits a second wavelength $\lambda 2$, the method comprising:
   (i) providing the apparatus of claim 11;
   (ii) energizing at lest said first laser and said second laser direct light of the first wavelength $\lambda 1$ along respective emission axes that extend in parallel and define a first plane;

(ii) forming a composite light beam of the first wavelength λ1 by disposing at an oblique angle the first surface of the filter apparatus, said the first surface being disposing at an oblique angle relative to the emission axes wherein the filter apparatus is formed on a transparent body that is situated in the path of the directed light,
wherein the filter apparatus forms the composite light beam by realigning the first and second axes along a second plane P2 that is orthogonal to plane P1 and parallel to the first direction;
and
(iii) directing the composite light beam toward an optical fiber.

20. The method of claim 19 further comprising changing a distance between realigned respective axes according to a change in an angle of rotation of the filter apparatus.

* * * * *